(12) United States Patent
Han

(10) Patent No.: US 10,535,835 B2
(45) Date of Patent: Jan. 14, 2020

(54) DISPLAY APPARATUS INCLUDING A CUSHION UNIT AND METHOD OF MANUFACTURING THE SAME

(71) Applicant: SAMSUNG DISPLAY CO., LTD., Yongin-si, Gyeonggi-Do (KR)

(72) Inventor: Jiwon Han, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 80 days.

(21) Appl. No.: 15/870,055

(22) Filed: Jan. 12, 2018

(65) Prior Publication Data

US 2019/0036066 A1 Jan. 31, 2019

(30) Foreign Application Priority Data

Jul. 25, 2017 (KR) ........................ 10-2017-0094318

(51) Int. Cl.
*H01L 21/00* (2006.01)
*H01L 51/52* (2006.01)
*B32B 7/12* (2006.01)
*B32B 5/18* (2006.01)
*B32B 27/06* (2006.01)
*B32B 27/40* (2006.01)
*B32B 27/30* (2006.01)
(Continued)

(52) U.S. Cl.
CPC ............ *H01L 51/5237* (2013.01); *B32B 5/18* (2013.01); *B32B 7/12* (2013.01); *B32B 27/065* (2013.01); *B32B 27/308* (2013.01); *B32B 27/40* (2013.01); *B32B 37/12* (2013.01); *H01L 51/5253* (2013.01); *H01L 51/56* (2013.01); *B32B 2266/0242* (2013.01); *B32B 2266/0278* (2013.01); *B32B 2457/206* (2013.01); *H01L 27/3244* (2013.01); *H01L 2227/323* (2013.01);
(Continued)

(58) Field of Classification Search
CPC ............. H01L 51/5237; H01L 51/0024; H01L 51/5253
See application file for complete search history.

(56) References Cited

U.S. PATENT DOCUMENTS 5,640,019 A * 6/1997 Ehemann, Jr. ..... G01N 21/6456
250/459.1
7,834,540 B2 * 11/2010 Lee ..................... H01L 23/26
313/504
(Continued)

FOREIGN PATENT DOCUMENTS

JP 05-205656 8/1993
KR 10-2015-0002354 1/2015
(Continued)

*Primary Examiner* — Laura M Menz
(74) *Attorney, Agent, or Firm* — F. Chau & Associates, LLC

(57) ABSTRACT

A display apparatus includes a protective film, a display panel, a cushion unit, and a first adhesive layer. The display panel is formed on the protective film, and includes a substrate and a display apparatus formed on the substrate. The cushion unit is formed on the protective film opposite to the display panel, and includes a cushion layer, a first cover layer, and a second cover layer. The first adhesive layer is formed between the first cover layer and the protective film. The cushion layer includes a plurality of pores formed on a first surface and a second surface opposite to the first surface thereof. The first cover layer is formed on the first surface. The second cover layer is formed on the second surface.

13 Claims, 6 Drawing Sheets

(51) Int. Cl.
*B32B 37/12* (2006.01)
*H01L 51/56* (2006.01)
*H01L 27/32* (2006.01)

(52) U.S. Cl.
CPC .......... *H01L 2251/5338* (2013.01); *H01L 2251/558* (2013.01)

(56) References Cited

U.S. PATENT DOCUMENTS

| | | | |
|---|---|---|---|
| 7,955,717 B2* | 6/2011 | Choi | H01L 51/5259 |
| | | | 313/504 |
| 9,083,003 B2* | 7/2015 | Lee | H01L 51/5268 |
| 9,140,838 B2 | 9/2015 | Lee et al. | |
| 9,657,040 B2* | 5/2017 | Igarashi | C07F 7/21 |
| 9,911,942 B2* | 3/2018 | Min | H01L 51/524 |
| 10,130,002 B2* | 11/2018 | Hwang | C09J 9/00 |
| 10,164,209 B2* | 12/2018 | Min | H01L 51/524 |
| 10,243,167 B2* | 3/2019 | Kang | H01L 51/5209 |
| 10,355,237 B2* | 7/2019 | Min | H01L 51/524 |
| 2016/0061685 A1 | 3/2016 | Kim | |
| 2016/0285064 A1* | 9/2016 | Hatta | H01M 2/166 |
| 2017/0324058 A1* | 11/2017 | Min | H01L 51/524 |
| 2018/0159067 A1* | 6/2018 | Min | H01L 51/524 |
| 2019/0036066 A1* | 1/2019 | Han | H01L 51/5237 |
| 2019/0081271 A1* | 3/2019 | Min | H01L 51/524 |

FOREIGN PATENT DOCUMENTS

| | | |
|---|---|---|
| KR | 10-2015-0053084 | 5/2015 |
| KR | 10-2016-0025152 | 3/2016 |

* cited by examiner

DISPLAY APPARATUS INCLUDING A CUSHION UNIT AND METHOD OF MANUFACTURING THE SAME

CROSS-REFERENCE TO RELATED APPLICATION

This application claims priority under 35 U.S.C. § 119 to Korean Patent Application No. 10-2017-0094318, filed on Jul. 25, 2017 in the Korean Intellectual Property Office, the disclosure of which is incorporated by reference herein in its entirety.

TECHNICAL FIELD

Exemplary embodiments of the present invention relate to a display apparatus, and more particularly to a display apparatus including a cushion unit and a method of manufacturing the same.

DISCUSSION OF RELATED ART

An organic light-emitting display apparatus has a relatively wide viewing angle, relatively high contrast, and a relatively quick response speed. Thus, the organic light-emitting display apparatus may be desirable from among display apparatuses.

The organic light-emitting display apparatus includes thin film transistors and organic light-emitting diodes arranged on a substrate. The organic light-emitting display apparatus operates as the organic light-emitting diodes emit light. The organic light-emitting display apparatus may be used as a display unit of relatively small products, such as mobile phones. The organic light-emitting display apparatus may also be used as a display unit of relatively large products such as televisions.

During manufacturing of a display apparatus display apparatus, bubbles may occur and craters may form on a surface of a cushion layer formed in a foam shape. Thus, a surface quality of the display apparatus may be decreased, for example, when the cushion layer is arranged under a display unit (e.g., to reduce or prevent the display unit from being damaged by an external impact).

SUMMARY

One or more exemplary embodiments of the present invention provide a display apparatus with increased surface reflection characteristics and relatively resistant against external impact, and a method of manufacturing the same.

One or more exemplary embodiments of the present invention provide a display apparatus. The display apparatus includes a protective film, a display panel, a cushion unit, and a first adhesive layer. The display panel is disposed on the protective film. The display panel includes a substrate and a display apparatus disposed on the substrate. The cushion unit is disposed on the protective film opposite to the display panel. The cushion unit includes a cushion layer, a first cover layer, and a second cover layer. The first adhesive layer is disposed between the first cover layer and the protective film. The cushion layer includes a plurality of pores disposed on a first surface and a second surface opposite to the first surface thereof. The first cover layer is disposed on the first surface. The second cover layer is disposed on the second surface.

The display apparatus may have a plurality of first spaces defined by the plurality of pores and the first cover layer, and a plurality of second spaces defined by the plurality of pores and the second cover layer.

The cushion layer may include a first organic material.

The first and second cover layers may include the first organic material.

The first and second cover layers may include a second organic material. The second inorganic material may be different from the first organic material.

The first organic material may include an acrylic organic material or a polyurethane organic material.

The cushion layer may have a thickness in a range of from about 100 μm to about 300 μm.

Each of the first cover layer and the second cover layer may have a thickness in a range of about 10 μm to about 30 μm.

Each of the plurality of pores may have a diameter in a range of from about 50 μm to about 150 μm.

The display apparatus may further include an adhesive layer. The adhesive layer may be disposed between the cushion layer and the first cover layer or between the cushion layer and the second cover layer.

The display apparatus may further include a lower plate and a second adhesive layer. The second adhesive layer may be disposed between the lower plate and the second cover layer.

A surface of the first cover layer in contact with the first surface of the cushion layer may be substantially flat.

A surface of the second cover layer in contact with the second surface of the cushion layer may be substantially flat.

One or more exemplary embodiments of the present invention provide a method of manufacturing a display apparatus. The method includes preparing a display panel including a substrate and a display apparatus formed on the substrate; arranging a protective film on a lower portion of the display panel; forming a cushion unit below the protective film, the cushion unit including a first cover layer, a second cover layer, and a cushion layer formed between the first cover layer and the second cover layer and having a plurality of pores; and forming a first adhesive layer between the first cover layer and the protective film.

Forming of the cushion unit may include forming the first cover layer on a first carrier film; forming the second cover layer on a second carrier film; applying a foam organic material layer on the first cover layer, the foam organic material layer including a first organic material; positioning the second cover layer on the organic material layer and laminating the first carrier film and the second carrier film with the organic material layer formed between the first carrier film and the second carrier film; and drying the organic layer.

The cushion layer may have a plurality of pores, and may have a plurality of pores formed among the plurality of pores and the first and second cover layers.

The first and second cover layers may include a second organic material. The second organic material may be different from the first organic material.

The first organic material may include an acrylic organic material or a polyurethane organic material.

The cushion layer may have a thickness in a range of from about 100 μm to about 300 μm.

Each of the first cover layer and the second cover layer may have a thickness in a range of from about 10 μm to about 30 μm.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
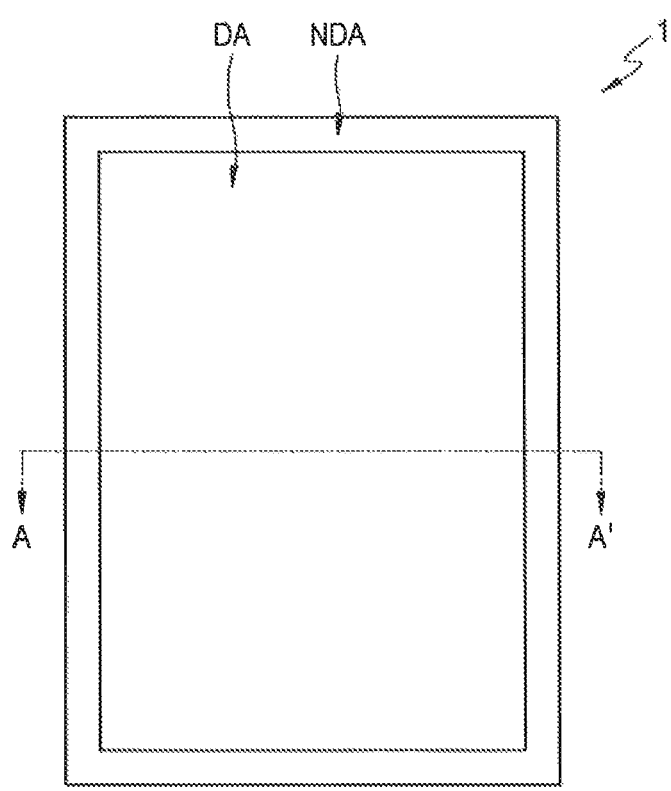
FIG. 1 is a plan view illustrating a display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

When a certain exemplary embodiment of the present invention may be implemented differently, a specific process order may be performed differently from the described order. For example, two consecutively described processes may be performed substantially at the same time or performed in an order opposite to the described order.

Figure 2:
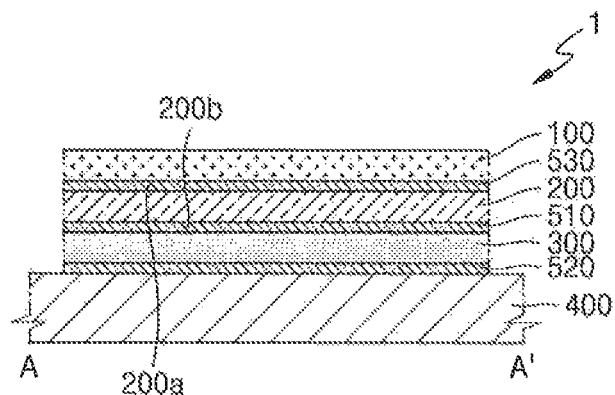
FIG. 2 is a cross-sectional view taken along a line A-A' illustrating a display apparatus of FIG. 1 according to an exemplary embodiment of the present invention.

FIG. 1 is a plan view illustrating a display apparatus according to an exemplary embodiment of the present invention. FIG. 2 is a cross-sectional view taken along a line A-A' of a display apparatus of FIG. 1 according to an exemplary embodiment of the present invention.

Referring to FIG. 1, a display apparatus 1 according to an exemplary embodiment of the present invention may include a display area DA and a non-display area NDA. The non-display area NDA may be formed outside the display area DA. For example, the non-display area NDA may surround the display area DA. The display area DA may be an area, for example, for substantially emitting light to display an image to the outside. The non-display area NDA may be an area, for example, in which elements and circuits for sealing the display area DA from the outside and driving the display area DA are arranged.

According to an exemplary embodiment of the present invention, the display apparatus 1 may include the display area DA arranged at the center thereof and the non-display area NDA surrounding the display area DA; however, exemplary embodiments of the present invention are not limited thereto. For example, the non-display area NDA may be arranged to surround only a portion of the display area DA. Alternatively, the non-display area NDA may be omitted.

Referring to FIG. 2, the display apparatus 1 according to an exemplary embodiment of the present invention may include a display panel 100, a protective film 200, a cushion unit 300, and a lower plate 400. The protective film 200 may be disposed below the display panel 100. The cushion unit 300 may be disposed below the protective film 200. The lower plate 400 may be disposed below the cushion unit 300. The display apparatus 1 may also include a first adhesive layer 510, a second adhesive layer 520, and a third adhesive layer 530. The third adhesive layer 530 may be formed between the display panel 100 and the protective film 200. The third first adhesive layer 510 may be formed between the protective film 200 and the cushion unit 300. The second adhesive layer 520 may be formed between the cushion unit 300 and the lower plate 400. The first adhesive layer 510, the second adhesive layer 520, and the third adhesive layer 530 may include, for example, a Pressure Sensitive Adhesive (PSA) or an Optically Clear Adhesive (OCA).

Figure 6:
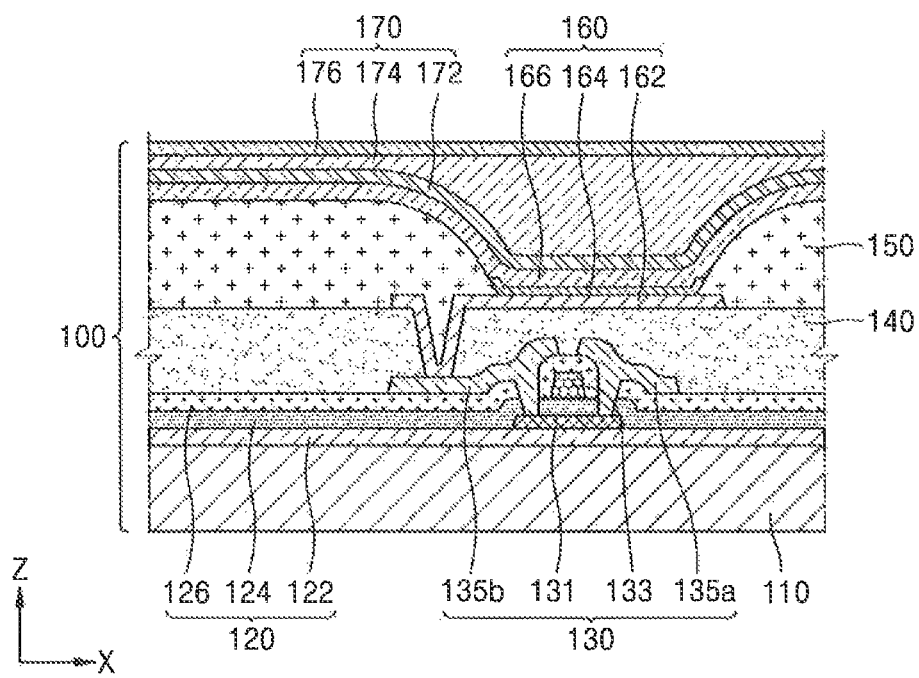
FIG. 6 is a cross-sectional view illustrating a pixel unit of a display apparatus of FIG. 1 according to an exemplary embodiment of the present invention.

Referring to FIG. 6, the display panel 100 may include a substrate 110 and a display device 160. The display device 160 may be arranged on the substrate 110. A thin-film transistor 130, for example, for driving the display device 160 may be formed on the substrate 110. An encapsulation layer 170, for example, for sealing the display device 160 from the outside may be disposed. For example, the encapsulation layer 170 may be formed on the display device 160. A structure of the display panel 100 will be described in more detail below with reference to FIG. 6.

The protective film 200 may have a first surface 200a and a second surface 200b. The second surface 200b may be opposite the first surface 200a. The display panel 100 may be arranged on the first surface 110A of the protective film 200. As described above, the third adhesive layer 530 may be formed between the protective film 200 and the display panel 100. The protective film 200 may include a flexible plastic material such as polyethylene terephthalate (PET), polyethylene naphthalate (PEN), or polyimide (PI). The protective film 200 may protect a lower portion of the substrate 110 of the display panel 100. The protective film 200 may also reduce or prevent impurities from penetrating into the display panel 100 through the lower portion of the substrate 110.

The cushion unit 300 may be arranged on the second surface 200b of the protective film 200. The cushion unit 300 may be formed between the lower plate 400 and the display panel 100, for example, to reduce or prevent external impact from being transmitted to the lower plate 400 and damaging the display panel 100.

Figure 3:
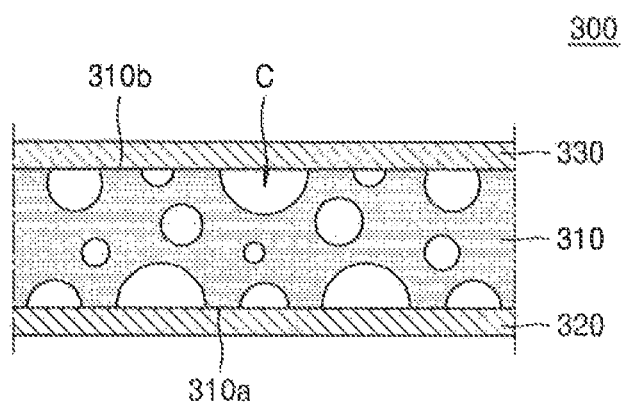
FIG. 3 is a cross-sectional view illustrating a cushion unit of a display apparatus of FIG. 1 according to an exemplary embodiment of the present invention.

FIG. 3 is a cross-sectional view illustrating a cushion unit of a display apparatus of FIG. 1 according to an exemplary embodiment of the present invention.

Referring to FIGS. 2 and 3, the cushion unit 300 according to an exemplary embodiment of the present invention may include a cushion layer 310, a first cover layer 320, and a second cover layer 330. The cushion layer 310 may have a first surface 310a and a second surface 310b. The second surface 310b may be opposite the first surface 310a. For example, the second surface 310b may be an upper surface of the cushion layer 310 in a plan view, and the first surface 310a may be a lower surface of the cushion layer 310 in a plan view; however, exemplary embodiments of the present invention are not limited thereto. The cushion layer 310 may have a plurality of pores including craters C. The plurality of craters C may be formed on at least one surface of the first surface 310a and the second surface 310b. For example, the plurality of craters C may be formed throughout the cushion layer 310. The first cover layer 320 may be formed on the first surface 310a of the cushion layer 310. The second cover layer 330 may be formed on the second surface 310b of the cushion layer 310.

The cushion layer 310 may be flexible, for example, to absorb shock. The cushion layer 310 may include a first organic material, for example, an acrylic organic material or a polyurethane organic material; however, exemplary embodiments of the present invention are not limited thereto. The cushion layer 310 according to an exemplary embodiment of the present invention may have a thickness in a range of from about 100 µm to about 300 µm.

The cushion layer 310 may have the first surface 310a and the second surface 310b, in which the second surface 310b is formed opposite to the first surface 310a. The cushion layer 310 may be formed in a foam shape, for example, having a plurality of craters C on the first surface 310a and the second surface 310b for shock absorption. The plurality of craters C may be formed, for example, by forming a plurality of pores on a surface (e.g., the first surface 310a and/or the second surface 310b) of the cushion layer 310. Furthermore, the cushion layer 310 may have pores not exposed to the surface (e.g., the first surface 310a and/or the second surface 310b) in the cushion layer 310. Thus, the plurality of craters C may be, for example, a portion of the surface of the cushion layer 310 which is formed in a concave shape and a portion formed in the shape of a circular pore inside the cushion layer 310. Each of the plurality of craters C according to an exemplary embodiment of the present invention may be formed to have a thickness in a range of from about 50 µm to about 150 µm.

Diameters of the plurality of craters C may be about half the thickness of the cushion layer 310 when the thickness of the cushion layer 310 is in a range of from about 100 µm to about 300 µm as described above. Therefore, the size of the plurality of craters C may be larger than the thickness of the cushion layer 310. Thus, the first surface 310a and the second surface 310b of the cushion layer 310 might not be substantially flat.

Adhesive layers (e.g., the first adhesive layer 510, the second adhesive layer 520, and/or the third adhesive layer 530) may be formed between the cushion layer 310 and the protective film 200 or the cushion layer 310 and the lower plate 400, for example, to adhere them to each other. The adhesive layers in contact with the cushion layer 310, for example, the first adhesive layer 510 and the second adhesive layer 520 as shown may be relatively fluid. Thus, a portion of an adhesive layer (e.g., the first adhesive layer 510, the second adhesive layer 520, and/or the third adhesive layer 530) may be at least partially buried in the plurality of craters C formed on a surface (e.g., the first surface 310a and/or the second surface 310b) of the cushion layer 310. At least a portion of the adhesive layer (e.g., the first adhesive layer 510, the second adhesive layer 520, and/or the third adhesive layer 530) may be at least partially buried in the plurality of craters C so that a surface of the adhesive layer (e.g., the first adhesive layer 510, the second adhesive layer 520, and/or the third adhesive layer 530) formed on the cushion layer 310 may be formed along a curvature of the plurality of craters C formed on the surface (e.g., the first surface 310a and/or the second surface 310b) of the cushion layer 310 in a portion where the plurality of craters C are formed. The curvature may affect the protective film 200 and the display panel 100 arranged on the adhesive layer (e.g., the first adhesive layer 510, the second adhesive layer 520, and/or the third adhesive layer 530). Thus, when the display apparatus 1 is flexible, a thin-film glass may be formed on an upper of the display apparatus 1. Such a thin-film glass may conform to irregularities of a lower member, for example, irregularities of the cushion unit 300. Accordingly, a surface quality of the display apparatus 1 may be reduced.

The display apparatus 1 according to an exemplary embodiment of the present invention may include the first cover layer 320 formed on the first surface 310a of the cushion layer 310, and the second cover layer 330 formed on the second surface 310b of the cushion layer 310. The first cover layer 320 may be formed on the first surface 310a of the cushion layer 310, for example, to substantially flatten a lower surface of the cushion layer 310. The second cover layer 330 may be formed on the second surface 310b of the cushion layer 310, for example, to substantially flatten an upper surface of the cushion unit 300. Therefore, a plurality of first spaces may be defined by the first cover layer 320 and the plurality of craters C formed on the first surface 310a of the cushion layer 310 and a plurality of second spaces defined by the second cover layer 330 and the plurality of craters C formed on the second surface 310b of the cushion layer 310. The plurality of pores among the first cover layer 320 and the second cover layer 330 and the plurality of craters C may provide that the first cover layer 320 and the second cover layer 330 or materials included in the same are not buried in the plurality of concave craters C. Thus, surfaces of the plurality of craters C contacting the first surface 310a of the cushion layer 310 and the second surface 310b of the cushion layer 310 may be substantially flat.

According to an exemplary embodiment of the present invention, the first cover layer 320 and the second cover layer 330 may include substantially a same material as a material included in the cushion layer 310. Thus, the cushion layer 310 may include a first organic material, and the first cover layer 320 and the second cover layer 330 may also include the first organic material. The first organic material may include, for example, an acrylic organic material or a polyurethane organic material; however, exemplary embodiments the present invention are not limited thereto.

In the display apparatus 1 according to an exemplary embodiment of the present invention, the first and second cover layers 320 and 330 may be respectively arranged on the first surface 310a and the second surface 310b of the cushion layer 310 and may substantially flatten the upper and lower surfaces of the cushion unit 300. Thus, the display apparatus 1 may be substantially resistant to external impact and a surface quality of the display apparatus 1 may increase.

Figure 4:
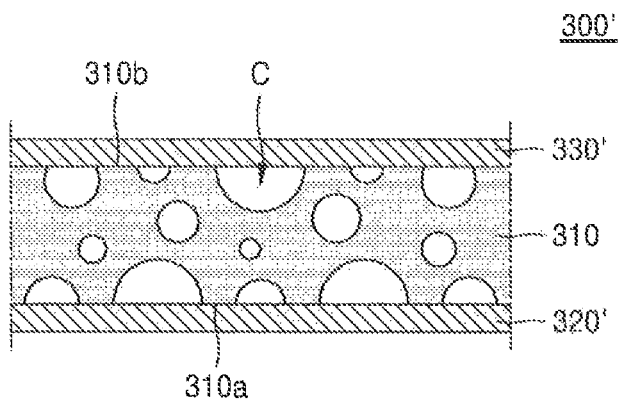
FIG. 4 is a cross-sectional view illustrating a cushion unit of a display apparatus according to an exemplary embodiment of the present invention.
Figure 5:
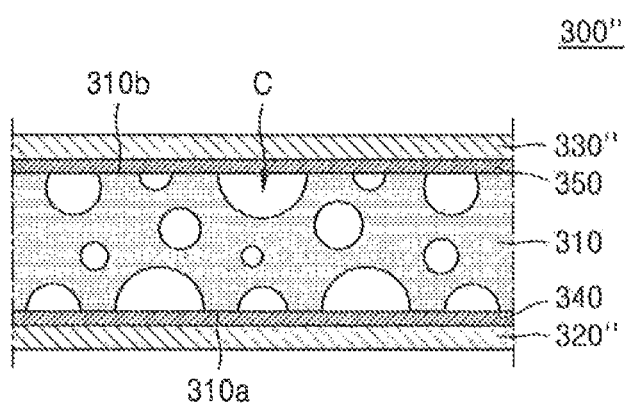
FIG. 5 is a cross-sectional view illustrating a cushion unit of a display apparatus according to an exemplary embodiment of the present invention.

FIG. 4 is a cross-sectional view illustrating a cushion unit of a display apparatus according to an exemplary embodiment of the present invention. FIG. 5 is a cross-sectional view illustrating a cushion unit of a display apparatus according to an exemplary embodiment of the present invention.

Referring to FIG. 4, a cushion unit 300' of the display apparatus 1 according to an exemplary embodiment of the present invention may include the cushion layer 310. The cushion layer 310 may include the plurality of craters C formed on the first surface 310a and on the second surface 310b opposite the first surface 310a. The cushion unit 300' may also include a first cover layer 320' and a second cover layer 330'. The first cover layer 320' may be formed on the first surface 310a of the cushion layer 310. The second cover layer 330' may be formed on the second surface 310b of the cushion layer 310.

The cushion layer 310 may be substantially the same as an exemplary embodiment of the present invention discussed above with reference to FIG. 3. Thus, repetitive descriptions thereof may be omitted.

The first cover layer 320' may be formed on the first surface 310a of the cushion layer 310. The second cover layer 330' may be formed on the second surface 310b of the cushion layer 310. The first cover layer 320' may be formed on the first surface 310a of the cushion layer 310, for example, to substantially flatten a lower surface of the cushion unit 300. The second cover layer 330' may be formed on the second surface 310b of the cushion layer 310, for example, to substantially flatten an upper surface of the cushion unit 300. According to an exemplary embodiment of the present invention, the first and second cover layers 320' and 330' may include a material different from a material included in the cushion layer 310. Thus, for example, the cushion layer 310 may include a first organic material, and the first and second cover layers 320' and 330' may each include a second organic material different from the first organic material. For example, when the first organic material includes an acrylic organic material or a polyurethane organic material, the first and second cover layers 320' and 330' may include an organic material other than the acrylic organic material or the polyurethane organic material included in the first organic material.

When the cushion layer 310 and the first and second cover layers 320' and 330' include different materials from each other, an adhesive strength between the cushion layer 310 and the first and second cover layers 320' and 330' may be relatively low as compared with when the cushion layer 310 and the first and second cover layers 320' and 330' include substantially a same material. Thus, an adhesive strength between the cushion layer 310 and the first and second cover layers 320' and 330' may be weakened when the cushion layer 310 and the first and second cover layers 320' and 330' are include different materials from each other as compared with when the cushion layer 310 and the first and second cover layers 320' and 330' include substantially a same material. The adhesive strength between the cushion layer 310 and the first and second cover layers 320' and 330' may be increased, for example, through a surface treatment process. The surface treatment process may be performed, for example, by a plasma treatment.

According to an exemplary embodiment of the present invention, referring to FIG. 5, the adhesive strength between the cushion layer 310 and the first and second cover layers 320' and 330' may be increased by disposing adhesives 340 and 350 between the cushion layer 310 and the first and second cover layers 320' and 330'.

FIG. 6 is a cross-sectional view illustrating a pixel unit of a display apparatus of FIG. 1 according to an exemplary embodiment of the present invention.

FIG. 6 is an enlarged view of a cross-section of a display panel of a display apparatus according to an exemplary embodiment of the present invention. FIG. 6 schematically illustrates a cross-section of a pixel (or a sub-pixel) including the display apparatus.

The display panel 100 according to an exemplary embodiment of the present invention may include the substrate 110, the display device 160, the thin-film transistor 130, and the encapsulation layer 170. The thin-film transistor 130 may be arranged on the substrate 110. The display device 160 may be electrically connected to the thin-film transistor 130. The encapsulation layer 170 may at least partially seal the display device 160.

The substrate 110 may include a variety of flexible or bendable materials. For example, the substrate 110 may include a polymer resin such as polyethersulphone (PES), polyacrylate (PAR), polyetherimide (PEI), PEN, PET, polyphenylene sulfide (PPS), polyarylate (PAR), polyimide (PI), polycarbonate (PC), or cellulose acetate propionate (CAP).

The thin-film transistor 130 may be formed on the substrate 110. The thin-film transistor 130 may include a semiconductor layer 131. The semiconductor layer 131 may include amorphous silicon, polycrystalline silicon, or an organic semiconductor material. The semiconductor layer 131 may also include a gate electrode 133, a source electrode 135a, and a drain electrode 135b.

A gate insulating film 124 may be formed between the semiconductor layer 131 and the gate electrode 133. The gate insulating film 142 may insulate the semiconductor layer 131 and the gate electrode 133. The gate insulating film 124 may include an inorganic material such as silicon oxide, silicon nitride, and/or silicon oxynitride. An interlayer insulating layer 126 may be disposed on the gate electrode 133. The interlayer insulating layer 126 may include an inorganic material such as silicon oxide, silicon nitride, and/or silicon oxynitride. The source electrode 135a and the drain electrode 135b may be disposed on the interlayer insulating film 126. The interlayer insulating 126 including an inorganic material may be formed by chemical vapor deposition (CVD) or atomic layer deposition (ALD).

A buffer layer 122 may be formed between the thin-film transistor 130 and the substrate 110 having such a structure. The buffer layer 122 may include an inorganic material such as silicon oxide, silicon nitride, and/or silicon oxynitride. The buffer layer 122 may substantially flatten an upper surface of the substrate 110. The buffer layer 122 may also reduce or prevent impurities from the substrate 110 or the like from penetrating into the semiconductor layer 131 of the thin-film transistor 130.

A planarization layer 140 may be formed on the thin-film transistor 130. For example, referring to FIG. 6, when the display device 160 is formed on the thin-film transistor 130, the planarization layer 140 may substantially flatten an upper portion of a protective film covering at least a portion of the thin-film transistor 130. The planarization layer 140 may include of an organic material such as acryl, benzocyclobutene (BCB), or hexamethyldisiloxane (HMDSO). Although the planarization layer 140 is illustrated as a single layer in FIG. 6, the planarization layer 140 may have multiple layers and various modifications may be made.

The display device 160 may be formed on the planarization layer 140. The display device 160 may include a pixel electrode 162, an opposite electrode 166, and an intermediate layer 164. The intermediate layer 164 may be formed between the pixel electrode 162 and the opposite electrode 166. The intermediate layer 164 may include an emission layer. Referring to FIG. 6, the pixel electrode 162 may be electrically connected to the thin-film transistor 130, for example, by contacting the source electrode 135a or the drain electrode 135b. For example, the pixel electrode 162 may contact the source electrode 135*a* or the drain electrode 135*b* through an opening formed in the planarization layer 140.

A pixel-defining layer 150 may be formed on the planarization layer 140. The pixel-defining layer 150 may define pixels, for example, by having an opening corresponding to each sub-pixel. Thus, the pixel-defining layer 150 may include an opening exposing at least a center portion of the pixel electrode 162. Referring to FIG. 6, the pixel-defining layer 150 may reduce or prevent formation of an arc or the like at an edge of the pixel electrode 262, for example, by increasing a distance between the edge of the pixel electrode 162 and the opposite electrode 166 disposed over the pixel electrode 162. The pixel-defining layer 150 may include an organic material such as PI or HMDSO.

The intermediate layer 164 of the display device 160 may include a low molecular weight material or a high molecular weight material. When the intermediate layer 164 includes a low molecular weight material, the intermediate layer 164 may be formed in a single or a composite structure, for example, by stacking a Hole Injection Layer (HIL), a Hole Transport Layer (HTL), an Emission Layer (EML), an Electron Transport Layer (ETL), and an Electron Injection Layer (EIL). The intermediate layer 164 may include various organic materials, such as copper phthalocyanine (CuPc), N,N'-Di(naphthalene-1-yl)-N,N'-diphenyl-benzidine (NPB), or tris-8-hydroxyquinoline aluminum (Alq3). The layers included in the intermediate layer 164 may be formed, for example, by an evaporation method.

When the intermediate layer 164 includes a polymer material, the intermediate layer 320 may have a structure including an HTL and an EML. The HTL may include poly(ethylenedioxythiophene) (PEDOT). The EML may include a polymer material, such as poly-phenylenevinylene (PPV) or polyfluorene. The intermediate layer 164 may be formed, for example, by using a screen printing method, an ink jet printing method, or a laser-induced thermal imaging (LITI) method.

The intermediate layer 164 is not limited thereto and may have various structures. The intermediate layer 164 may include a single body layer disposed over a plurality of pixel electrodes 162. Alternatively, the intermediate layer 164 may have a layer patterned to correspond to each of the pixel electrodes 162.

The opposite electrode 166 may be disposed on the intermediate layer 164. The opposite electrode 166 may correspond to the plurality of the pixel electrodes 162, for example, by being formed as a single body over a plurality of display devices 160.

The encapsulation layer 170 may cover at least a portion of the display device 160. The encapsulation layer 170 may protect the display device 160, for example, by reducing or preventing moisture or oxygen from the outside from penetrating the display device 160. The encapsulation layer 170 may be formed on at least a portion of the substrate 110. For example, the encapsulation layer 170 may be disposed over the entire surface of the substrate 110 and extend to an edge of the substrate 110. Referring to FIG. 6, the encapsulation layer 170 may include a first inorganic encapsulation film 172, an organic encapsulation film 174, and a second inorganic encapsulation film 176.

The first inorganic encapsulation film 172 may at least partially cover the opposite electrode 166. The first inorganic encapsulation film 172 may include silicon oxide, silicon nitride, and/or silicon oxynitride. A capping layer may be formed between the first inorganic encapsulation film 172 and the opposite electrode 166.

Since the first inorganic encapsulation film 172 may be formed along a lower structure thereof, an upper surface of the first inorganic encapsulation film 172 might not be substantially flat as illustrated in FIG. 6. The organic encapsulation film 174 may at least partially cover the first inorganic encapsulation layer 172. However, an upper surface of the organic encapsulation film 174 may be substantially flat. The organic encapsulation film 174 may include at least one selected from PET, PEN, PC, PI, PES, polyoxymethylene (POM), PAR, or HMDSO.

The second inorganic encapsulation film 176 may cover at least a portion of the organic encapsulation film 174. The second inorganic encapsulation film 176 may include $SiO_2$, SiNx, and/or SION. Since the second inorganic encapsulation film 176 contacts the first inorganic encapsulation film 172 at the edge of the substrate 110, the second inorganic encapsulation film 176 may reduce or prevent the organic encapsulation film 174 from exposure to the outside.

Since the encapsulation layer 170 may have a multi-layered structure including the first inorganic encapsulation film 172, the organic encapsulation film 174, and the second inorganic encapsulation film 176, if a crack occurs in the encapsulation layer 170, the crack might not be connected between the first inorganic encapsulation film 172 and the organic encapsulation film 174, or between the organic encapsulation film 174 and the second inorganic encapsulation film 176 through the multi-layered structure of the encapsulation layer 170. Thus, the formation of a path of external moisture or oxygen penetrating into the display unit may be reduced or prevented.

A touch sensor layer may be formed on the display panel 100. Furthermore, functional layers such as a capping layer and an adhesive layer may be formed between the display panel 100 and the touch sensor layer. The touch sensor layer may be formed on a transparent substrate in the form of a separate panel. The touch sensor may be laminated with the display panel 100. Alternatively, the touch sensor may form a pattern directly on the display panel 100.

As described above, in the display apparatus 1 according to an exemplary embodiment of the present invention, the cushion unit 300 may be formed between the lower plate 400 and the display panel 100, for example, to mitigate impact applied to the lower plate 400 from the outside which may be transmitted to the display panel 100.

The cushion layer 310 may be a shock absorber in the cushion unit 300. The cushion layer 310 may be formed in a foam shape. The cushion layer 310 may include a flexible and cushioning material. Thus, the plurality of craters C may be formed on the surface of the cushion layer 310.

Adhesive layers formed between the cushion layer 310 and the protective film 200 or the cushion layer 310 and the lower plate 400 may adhere them to each other. The adhesive layers in contact with the cushion layer 310 may be relatively fluid. Thus, a portion of an adhesive layer may be at least partially buried in the plurality of craters C formed on a surface of the cushion layer 310. At least a portion of the adhesive layer may be at least partially buried in the plurality of craters C so that a surface of the adhesive layer formed on the cushion layer 310 may be formed along a curvature of the plurality of craters C formed on the surface of the cushion layer 310 in a portion where the plurality of craters C are formed. The curvature may affect the protective film 200 and the display panel 100 arranged on the adhesive layer. Thus, when the display apparatus 1 is flexible, a thin-film glass may be formed on the upper surface of the display apparatus 1. Such a thin-film glass may conform to irregularities of a lower member, for example, irregularities of the cushion unit 300. Accordingly, a surface quality of the display apparatus 1 may be reduced.

The display apparatus 1 according to an exemplary embodiment of the present invention may include the first cover layer 320 formed on the first surface 310a, and the second cover layer 330 formed on the second surface 310b of the cushion layer 310. The first cover layer 320 may be formed on the first surface 310a, for example, to substantially flatten a lower surface of the cushion unit 300. The second cover layer 330 may be formed on the second surface 310b of the cushion layer 310, for example, to substantially flatten an upper surface of the cushion unit 300. Thus, the display apparatus 1 may be substantially resistant to external impact and a surface quality of the display apparatus 1 may increase.

Although the display apparatus 1 has been described in detail herein, the present disclosure is not limited thereto. For example, exemplary embodiments of the present invention provide a method of manufacturing the display apparatus.

FIGS. 7 to 10 are cross-sectional views illustrating a method of manufacturing the display apparatus of FIG. 1 according to an exemplary embodiment of the present invention.

Figure 7:
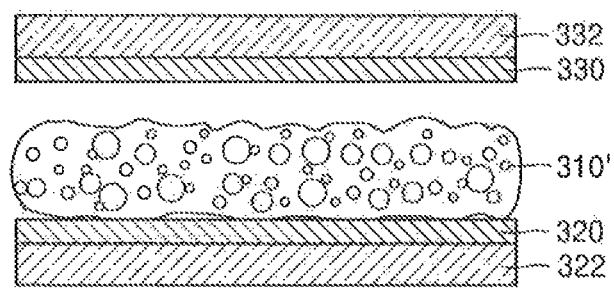
FIGS. 7 to 10 are cross-sectional views illustrating a method of manufacturing a display apparatus of FIG. 1 according to an exemplary embodiment of the present invention.

FIG. 7 illustrates a method of forming the cushion unit 300. The cushion unit 300 may be formed by forming the first cover layer 320 on a first carrier film 322 and forming the second cover layer 330 on a second carrier film 332. The first and second carrier films 322 and 332 may be the substrate 110 for forming the first and second cover layers 320 and 330. For example, the first and second carrier films 322 and 332 may include a flexible plastic material such as PET, PEN, or polyimide (PI). The first and second carrier films 322 and 332 may be flexible, but may also form and support the first cover layer 320. The first and second carrier films 322 and 332 may each have a thickness of, for example, about 100 μm or greater.

The first and second cover layers 320 and 330 may include a first organic material. The first organic material may include, for example, an acrylic organic material or a polyurethane organic material. Each of the first and second cover layers 320 and 330 may have a thickness in a range of from about 10 μm to about 30 μm.

A foam organic material layer 310' may be applied on the first cover layer 320 formed on the first carrier film 322. The foam organic material layer 310' may be formed, for example, by injecting a plurality of bubbles into the first organic material. Thus, the foam organic material layer 310' may have a cushion-like characteristic. The organic material layer 310' may include the first organic material as described above. The first organic material may include, for example, an acrylic organic material or a polyurethane organic material.

After the organic material layer 310' is coated on the first cover layer 320, the second carrier film 332 having the second cover layer 330 may be formed on the organic material layer 310'. The second cover layer 330 may be disposed to face the organic material layer 310'.

Figure 8:
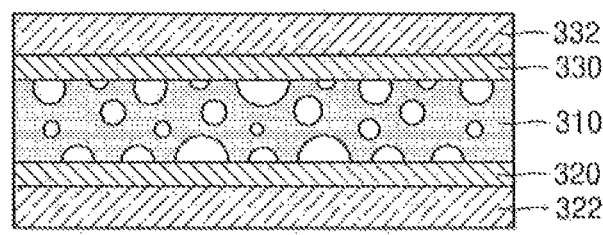

Referring to FIG. 8, the second cover layer 330 may be adjoined onto the organic layer 310' formed on the first cover layer 320. That is, the first cover layer 320 formed on the first carrier film 322 and the second cover layer 330 formed on the second carrier film 332 may be laminated to face each other. The organic material layer 310' may be formed between the first cover layer 320 and the second cover layer 330.

The organic material layer 310' may be formed into the cushion layer 310, for example, through a drying process. Since the organic material layer 310' is formed by injecting air into the first organic material and foaming the air, the organic material layer 310' may include a relatively fluid material. Furthermore, the cushion layer 310 may be formed, for example, by drying the organic material layer 310'.

Figure 9:
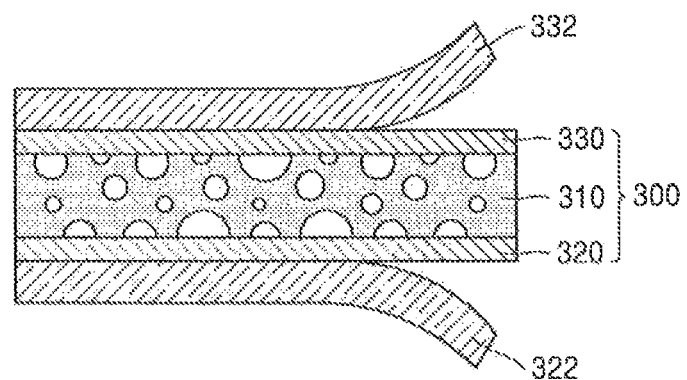

Referring to FIG. 9, the first and second carrier films 322 and 332 may be removed. For example, the first and second carrier films 322 and 332 may be peeled off by a physical force; however, exemplary embodiments of the present invention are not limited thereto.

In order to peel off the first and second carrier films 322 and, a degree of an adhesive strength between the first carrier film 322 and the second carrier film 332 and between the first cover layer 320 and the second cover layer 330 may be considered. If the adhesive strength between the first carrier film 322 and the first cover layer 320 is relatively weak, it may be relatively difficult to stably form the first cover layer 320 on the first carrier film 322. If the adhesive strength between the first carrier film 322 and the first cover layer 320 is relatively strong, it may be relatively difficult to peel off and remove the second carrier film 332.

Therefore, a surface treatment may be performed on the first and second carrier films 322 and 332, for example, to adjust the adhesive strength between the first carrier film 322 and the second carrier film 332 and between the first cover layer 320 and the second cover layer 330. The adhesive strength between the first carrier film 322 and the second carrier film 332 and between the first cover layer 320 and the second cover layer 330 may be adjusted, for example, by performing the surface treatment on the first and second carrier films 322 and 332 before forming the first and second cover layers 320 and 330. The surface treatment process may use, for example, a surface treatment process known to those skilled in the art in addition to plasma treatment or a method using an adhesive.

Figure 10:
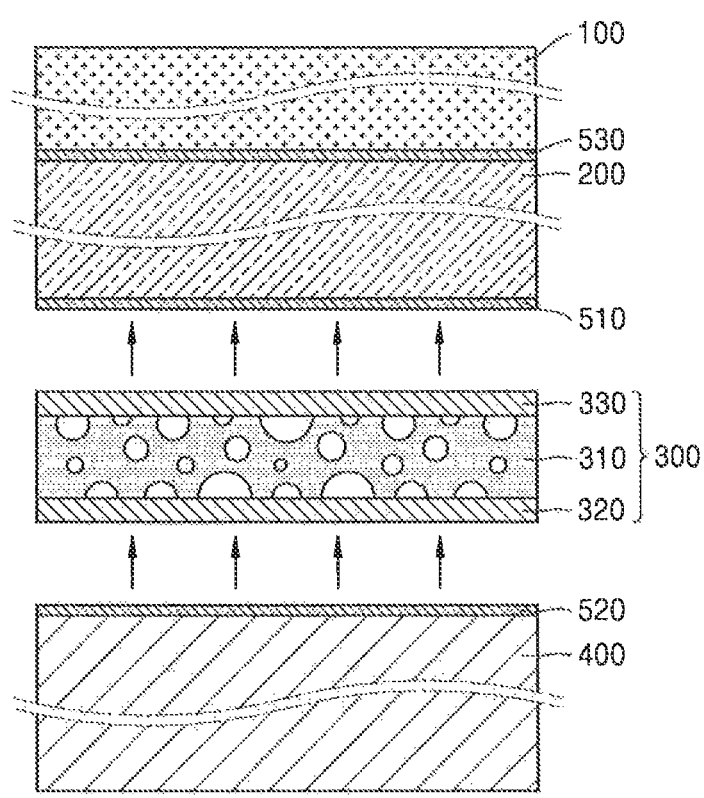

Thereafter, referring to FIG. 10, after the cushion unit 300 is formed, the cushion unit 300 may be attached to a lower portion of the display panel 100 to which the protective film 200 is attached. The display panel 100 and the protective film 200 may be substantially the same as those in the above-described exemplary embodiments of the present invention, and a repeated description thereof may be omitted.

As illustrated in FIG. 10, after the display panel 100 is formed, the protective film 200 may be attached to the first surface 310a of the display panel 100, that is, a surface of the display panel 100 on which the substrate 110 is positioned. The third adhesive layer 530 may be formed between the display panel 100 and the protective film 200. Accordingly, the display panel 100 and the protective film 200 may be attached to each other.

The cushion unit 300 may be attached to a lower portion of the protective film 200. The first adhesive layer 510 may be formed between the protective film 200 and the cushion unit 300, for example, to attach the protective film 200 and the cushion unit 300 to each other. Thus, the display panel 100 and the protective film 200 may be located on the first surface 310a of the cushion unit 300 with respect to the cushion unit 300, and the lower plate 400 may be located on the second surface 310b of the cushion unit 300. The second adhesive layer 520 may be formed between the cushion unit 300 and the lower plate 400, for example, to attach the cushion unit 300 and the lower plate 400 to each other. The third adhesive layer 530, the first adhesive layer 510, and the second adhesive layer 520 may be, for example, a PSA, or an OCA.

In the display apparatus 1 according to an exemplary embodiment of the present invention, the first and second cover layers 320 and 330 may be respectively arranged on the first surface 310a and the second surface 310b of the cushion layer 310, for example, to substantially flatten the lower and upper surfaces of the cushion unit 300, respectively. Thus, the display apparatus 1 may be substantially resistant to external impact and a surface quality of the display apparatus 1 may be increased.

According to exemplary embodiments of the present invention as described above, a display apparatus with increased surface reflection characteristics that is substantially resistant against external impact and a method of manufacturing the same may be provided. However, the scope of the present disclosure is not limited thereto.

It should be understood that exemplary embodiments of the present invention described herein should be considered in a descriptive sense only and not for purposes of limitation. Descriptions of features or aspects within each exemplary embodiment of the present invention should typically be considered as available for other similar features or aspects in other exemplary embodiments of the present invention.

While one or more exemplary embodiments of the present invention have been described with reference to the figures, it will be understood by those of ordinary skill in the art that various changes in form and details may be made therein without departing from the spirit and scope of the present invention as defined by the following claims.

What is claimed is:

1. A display apparatus, comprising:
a protective film;
a display panel disposed on the protective film, and comprising a substrate and a display device disposed on the substrate;
a cushion unit disposed on the protective film opposite to the display panel, the cushion unit comprising a cushion layer, a first cover layer, and second cover layer; and
a first adhesive layer disposed between the first cover layer and the protective film,
wherein the cushion layer includes a plurality of pores disposed on at least one surface of a first surface and a second surface opposite to the first surface thereof, the first cover layer is disposed on the first surface and the second cover layer is disposed on the second surface.

2. The display apparatus of claim 1, having a plurality of first spaces defined by the plurality of pores and the first cover layer, and a plurality of second spaces defined by the plurality of pores and the second cover layer.

3. The display apparatus of claim 1, wherein
the cushion layer comprises a first organic material.

4. The display apparatus of claim 3, wherein
the first and second cover layers comprise the first organic material.

5. The display apparatus of claim 3, wherein
the first and second cover layers comprise a second organic material, the second organic material being different from the first organic material.

6. The display apparatus of claim 3, wherein
the first organic material comprises an acrylic organic material or a polyurethane organic material.

7. The display apparatus of claim 1, wherein
the cushion layer has a thickness in a range of from about 100 μm to about 300 μm.

8. The display apparatus of claim 1, wherein
each of the first cover layer and the second cover layer has a thickness in a range of from about 10 μm to about 30 μm.

9. The display apparatus of claim 2, wherein
each of the plurality of pores has a diameter in a range of from about 50 μm to about 150 μm.

10. The display apparatus of claim 1, further comprising:
an adhesive layer disposed between the cushion layer and the first cover layer or between the cushion layer and the second cover layer.

11. The display apparatus of claim 1, further comprising:
a lower plate; and
a second adhesive layer disposed between the lower plate and the second cover layer.

12. The display apparatus of claim 1, wherein
a surface of the first cover layer in contact with the first surface of the cushion layer is substantially flat.

13. The display apparatus of claim 1, wherein
a surface of the second cover layer in contact with the second surface of the cushion layer is substantially flat.

* * * * *